United States Patent
Progler

(10) Patent No.: US 7,943,273 B2
(45) Date of Patent: May 17, 2011

(54) PHOTOMASK WITH DETECTOR FOR OPTIMIZING AN INTEGRATED CIRCUIT PRODUCTION PROCESS AND METHOD OF MANUFACTURING AN INTEGRATED CIRCUIT USING THE SAME

(75) Inventor: Christopher J. Progler, Plano, TX (US)

(73) Assignee: Photronics, Inc., Brookfield, CT (US)

( * ) Notice: Subject to any disclaimer, the term of this patent is extended or adjusted under 35 U.S.C. 154(b) by 233 days.

(21) Appl. No.: 12/106,014

(22) Filed: Apr. 18, 2008

(65) Prior Publication Data

US 2008/0261127 A1 Oct. 23, 2008

Related U.S. Application Data

(63) Continuation-in-part of application No. 11/788,473, filed on Apr. 20, 2007.

(51) Int. Cl.
*G03F 1/00* (2006.01)
*G03C 5/00* (2006.01)

(52) U.S. Cl. ............................................. 430/5; 430/30

(58) Field of Classification Search ................ 430/5, 22, 430/30, 311–313; 355/30, 53; 382/144; 356/121, 400

See application file for complete search history.

(56) References Cited

U.S. PATENT DOCUMENTS

| | | | |
|---|---|---|---|
| 4,014,602 A | 3/1977 | Ruell | |
| 4,477,182 A | 10/1984 | Takanashi et al. | |
| 4,576,439 A | 3/1986 | Gale et al. | |
| 4,662,653 A | 5/1987 | Greenaway | |
| 4,663,625 A | 5/1987 | Yewen | |
| 5,361,307 A | 11/1994 | Hartley et al. | |
| 5,379,131 A | 1/1995 | Yamazaki | |
| 5,528,402 A | 6/1996 | Parker | |
| 5,734,752 A | 3/1998 | Knox | |
| 5,790,703 A | 8/1998 | Wang | |
| 5,909,313 A | 6/1999 | Lee | |
| 5,949,055 A | 9/1999 | Fleet et al. | |
| 6,001,510 A | 12/1999 | Meng et al. | |
| 6,057,082 A | 5/2000 | Korth | |
| 6,127,069 A | 10/2000 | Balz et al. | |
| 6,160,782 A | 12/2000 | Kayanuma et al. | |
| 6,207,330 B1 | 3/2001 | Balz et al. | |
| 6,337,752 B1 | 1/2002 | Heckenkamp et al. | |
| 6,359,734 B1 | 3/2002 | Staub et al. | |
| 6,421,013 B1 | 7/2002 | Chung | |

(Continued)

OTHER PUBLICATIONS

Nomura, Hiroshi and Furutono, Yohkoet al., "In-situ polarimetry of illumination for 193-nm lithography,", Proc. of SPIE vol. 6924 69241T, (2008), Optical Microlithography XXI, pp. 1-12.

(Continued)

*Primary Examiner* — Stephen Rosasco
*Assistant Examiner* — Stewart A Fraser
(74) *Attorney, Agent, or Firm* — Amster, Rothstein & Ebenstein LLP

(57) ABSTRACT

A photomask for integrated circuit production for development of integrated circuit components, where the integrated circuit production uses a radiation source that generates a source image, includes a substrate with one or more layers disposed thereon; a source separator element that separates the source image into one or more duplicate source images; one or more polarizing elements each corresponding to one of the one or more duplicate source images; and one or more sensors each corresponding to one of the one or more polarizing elements, the one or more sensors sensing one or more radiation characteristics of the radiation source.

17 Claims, 9 Drawing Sheets

U.S. PATENT DOCUMENTS

| | | |
|---|---|---|
| 6,449,377 B1 | 9/2002 | Rhoads |
| 6,597,427 B1 | 7/2003 | Katsu et al. |
| 6,610,351 B2 | 8/2003 | Shchegolikhin et al. |
| 6,614,235 B2 | 9/2003 | Kraz |
| 6,693,432 B2 | 2/2004 | Kraz |
| 6,700,385 B2 | 3/2004 | Kraz |
| 6,706,314 B2 | 3/2004 | Butland |
| 6,734,931 B2 | 5/2004 | Yu |
| 6,740,472 B2 | 5/2004 | Karasev |
| 6,780,564 B2 | 8/2004 | Lawandy et al. |
| 6,822,769 B1 | 11/2004 | Drinkwater et al. |
| 6,855,463 B2 | 2/2005 | Lassiter et al. |
| 6,860,927 B2 | 3/2005 | Kuntz et al. |
| 6,882,737 B2 | 4/2005 | Lofgren et al. |
| 6,887,650 B2 | 5/2005 | Shimoda et al. |
| 6,894,766 B1 | 5/2005 | West et al. |
| 6,903,850 B2 | 6/2005 | Kay et al. |
| 6,964,837 B2 | 11/2005 | Schrof et al. |
| 6,972,836 B2 * | 12/2005 | Sato et al. ............. 356/121 |
| 7,057,259 B2 | 6/2006 | Arikado et al. |
| 7,063,924 B2 | 6/2006 | Kaminsky et al. |
| 7,108,171 B1 | 9/2006 | Ergo et al. |
| 7,204,419 B2 | 4/2007 | Lizotte et al. |
| 7,220,535 B2 | 5/2007 | Lawandy et al. |
| 7,234,645 B2 | 6/2007 | Silverbrook et al. |
| 7,265,904 B2 | 9/2007 | Schilling et al. |
| 7,281,810 B2 | 10/2007 | Lee |
| 2002/0167653 A1 | 11/2002 | Mulkens et al. |
| 2003/0052691 A1 | 3/2003 | Kraz |
| 2003/0179277 A1 | 9/2003 | Stadler et al. |
| 2004/0043308 A1 | 3/2004 | Lutz et al. |
| 2004/0121268 A1 | 6/2004 | Conroy et al. |
| 2004/0169516 A1 | 9/2004 | Kraz |
| 2005/0008944 A1 | 1/2005 | Cerrina et al. |
| 2005/0019680 A1 | 1/2005 | Pinchen |
| 2005/0056441 A1 | 3/2005 | Rider et al. |
| 2005/0134463 A1 | 6/2005 | Yamazaki |
| 2006/0043197 A1 | 3/2006 | Chang et al. |
| 2006/0154180 A1 | 7/2006 | Kannurpatti |
| 2007/0037070 A1 | 2/2007 | Ohnuma et al. |
| 2007/0071306 A1 * | 3/2007 | Fukuhara et al. ............. 382/144 |
| 2007/0148599 A1 | 6/2007 | True |
| 2007/0218667 A1 * | 9/2007 | Rider ............. 438/585 |

OTHER PUBLICATIONS

Zanzal, Andrew, "Benchmark Technologies and Estion Sign Distribution Agreement for Insitu Electric Field Test Reticle," dated Feb. 2, 2009, Benchmark Technologies, Inc., Lynnfield, Massachusetts.

Zanzal, Andrew, "Benchmark Technologies and Estion Sign Distribution Agreement for Insitu Electric Field Test Reticle," dated Feb. 13, 2009, Benchmark Technologies, Inc., Lynnfield, Massachusetts.

* cited by examiner

CONVENTIONAL ART

CONVENTIONAL ART

CONVENTIONAL ART

PHOTOMASK WITH DETECTOR FOR OPTIMIZING AN INTEGRATED CIRCUIT PRODUCTION PROCESS AND METHOD OF MANUFACTURING AN INTEGRATED CIRCUIT USING THE SAME

RELATED APPLICATIONS

This application is a continuation-in-part of U.S. patent application Ser. No. 11/788,473, filed Apr. 20, 2007, the contents of which are incorporated herein by reference.

FIELD OF THE INVENTION

The present invention generally relates to photomasks and optical lithography for fabrication of integrated circuits. The present invention also generally relates to a method of manufacturing integrated circuits using photomasks.

BACKGROUND OF THE INVENTION

Photomasks are high precision plates containing microscopic images of electronic circuits. Photomasks are typically made from very flat pieces of quartz or glass with a layer of chrome on one side. Etched in the chrome is a portion of an electronic circuit design. This circuit design on the mask is also called "geometry." A typical photomask used in the production of semiconductor devices is formed from a "blank" or "undeveloped" photomask. As shown in FIG. 1, a typical blank photomask 5 is comprised of three or four layers. The first layer 11 is a layer of quartz or other substantially transparent material, commonly referred to as the substrate. The next layer is typically a layer of opaque material 12, such as Cr, which often includes a third layer of antireflective material 13, such as CrO. The antireflective layer may or may not be included in any given photomask. The top layer is typically a layer of photosensitive resist material 14. Other types of photomasks are also known and used including, but not limited to, phase shift masks, embedded attenuated phase shift masks ("EAPSM") and alternating aperture phase shift masks ("AAPSM"). These types of phase shift masks are characterized by design features including opaque regions and partially transparent regions through which the phase of light is shifted by, for example, approximately 180°. Examples of such photomasks are described in U.S. Pat. No. 6,682,861, U.S. Patent Publication No. 2004-0185348 A1, U.S. Patent Publication No. 2005-0026053 and U.S. Patent Publication No. 2005-0053847 to Photronics, Inc., the contents of which are incorporated by reference herein.

The process of manufacturing a photomask involves many steps and can be time consuming. In this regard, to manufacturer a photomask, the desired pattern of opaque material 12 to be created on the photomask 5 is typically defined by an electronic data file loaded into an exposure system which typically scans an electron beam (E-beam) or laser beam in a raster or vector fashion across the blank photomask. One such example of a raster scan exposure system is described in U.S. Pat. No. 3,900,737 to Collier. Each unique exposure system has its own software and format for processing data to instruct the equipment in exposing the blank photomask. As the E-beam or laser beam is scanned across the blank photomask 10, the exposure system directs the E-beam or laser beam at addressable locations on the photomask as defined by the electronic data file. The areas of the photosensitive resist material that are exposed to the E-beam or laser beam become soluble while the unexposed portions remain insoluble.

In order to determine where the e-beam or laser should expose the photoresist 14 on the blank photomask 5, and where it should not, appropriate instructions to the processing equipment need to be provided, in the form of a jobdeck. In order to create the jobdeck the images of the desired pattern are broken up (or fractured) into smaller standardized shapes, e.g., rectangles and trapezoids. The fracturing process can be very time consuming. After being fractured, the image may need to be further modified by, for example, sizing the data if needed, rotating the data if needed, adding fiducial and internal reference marks, etc. Typically a dedicated computer system is used to perform the fracturing and/or create the jobdecks. The jobdeck data must then be transferred to the processing tools, to provide such tools with the necessary instructions to expose the photomask.

After the exposure system has scanned the desired image onto the photosensitive resist material 14, as shown in FIG. 2, the soluble photosensitive resist material is removed by means well known in the art, and the unexposed, insoluble photosensitive resist material 14' remains adhered to the opaque material 13 and 12. Thus, the pattern to be formed on the photomask 5 is formed by the remaining photosensitive resist material 14'.

The pattern is then transferred from the remaining photoresist material 14' to the photomask 5 via known etch processes to remove the antireflective material 13 and opaque materials 12 in regions which are not covered by the remaining photoresist 14'. There is a wide variety of etching processes known in the art, including dry etching as well as wet etching, and thus a wide variety of equipment is used to perform such etching. After etching is complete, the remaining photoresist material 14' is stripped or removed and the photomask is completed, as shown in FIG. 3. In the completed photomask, the pattern as previously reflected by the remaining antireflective material 13' and opaque materials 12' are located in regions where the remaining photoresist 14' remain after the soluble materials were removed in prior steps.

In order to determine if there are any unacceptable defects in a particular photomask, it is necessary to inspect the photomask. A defect is any flaw affecting the geometry. This includes undesirable chrome areas (chrome spots, chrome extensions, chrome bridging between geometry) or unwanted clear areas (pin holes, clear extensions, clear breaks). A defect can cause the circuit to be made from the photomask not to function. The entity ordering the photomask will indicate in its defect specification the size of defects that will affect its process. All defects of that size and larger must be repaired, or if they cannot be repaired, the mask must be rejected and rewritten.

Typically, automated mask inspection systems, such as those manufactured by KLA-Tencor or Applied Materials, are used to detect defects. Such automated systems direct an illumination beam at the photomask and detect the intensity of the portion of the light beam transmitted through and reflected back from the photomask. The detected light intensity is then compared with expected light intensity, and any deviation is noted as a defect. The details of one system can be found in U.S. Pat. No. 5,563,702 assigned to KLA-Tencor.

After passing inspection, a completed photomask is cleaned of contaminants. Next, a pellicle may be applied to the completed photomask to protect its critical pattern region from airborne contamination. Subsequent through pellicle defect inspection may be performed. In some instances, the photomask may be cut either before or after a pellicle is applied.

Before performing each of the manufacturing steps described above, a semiconductor manufacturer (e.g., customer) must first provide a photomask manufacturer with different types of data relating to the photomask to be manufactured. In this regard, a customer typically provides a photomask order which includes various types of information and data which are needed to manufacture and process the photomask, including, for example, data relating to the design of the photomask, materials to be used, delivery dates, billing information and other information needed to process the order and manufacture the photomask.

After the manufacturing steps described above are completed, the completed photomask is sent to a customer for use to manufacture semiconductor and other products. In particular, photomasks are commonly used in the semiconductor industry to transfer micro-scale images defining a semiconductor circuit onto a silicon or gallium arsenide substrate or wafer. The process for transferring an image from a photomask to a silicon substrate or wafer is commonly referred to as lithography or microlithography. Typically, as shown in FIG. 4, the semiconductor manufacturing process comprises the steps of deposition, photolithography, and etching. During deposition, a layer of either electrically insulating or electrically conductive material (like a metal, polysilicon or oxide) is deposited on the surface of a silicon wafer. This material is then coated with a photosensitive resist. The photomask is then used much the same way a photographic negative is used to make a photograph. Photolithography involves projecting the image on the photomask onto the wafer. If the image on the photomask is projected several times side by side onto the wafer, this is known as stepping and the photomask is called a reticle.

As shown in FIG. 5, to create an image 21 on a semiconductor wafer 20, a photomask 5 is interposed between the semiconductor wafer 20, which includes a layer of photosensitive material, and an optical system 22. Energy generated by an energy source 23, commonly referred to as a Stepper, is inhibited from passing through the areas of the photomask 5 where the opaque material is present. Energy from the Stepper 23 passes through the transparent portions of the quartz substrate 11 not covered by the opaque material 12 and the antireflective material 13. The optical system 22 projects a scaled image 24 of the pattern of the opaque material 12 and 13 onto the semiconductor wafer 20 and causes a reaction in the photosensitive material on the semiconductor wafer. The solubility of the photosensitive material is changed in areas exposed to the energy. In the case of a positive photolithographic process, the exposed photosensitive material becomes soluble and can be removed. In the case of a negative photolithographic process, the exposed photosensitive material becomes insoluble and unexposed soluble photosensitive material is removed.

After the soluble photosensitive material is removed, the image or pattern formed in the insoluble photosensitive material is transferred to the substrate by a process well known in the art which is commonly referred to as etching. Once the pattern is etched onto the substrate material, the remaining resist is removed resulting in a finished product. A new layer of material and resist is then deposited on the wafer and the image on the next photomask is projected onto it. Again the wafer is developed and etched. This process is repeated until the circuit is complete. Because, in a typical semiconductor device many layers may be deposited, many different photomasks may be necessary for the manufacture of even a single semiconductor device. Indeed, if more than one piece of equipment is used by a semiconductor manufacturer to manufacture a semiconductor device, it is possible more than one photomask may be needed, even for each layer. Furthermore, because different types of equipment may also be used to expose the photoresist in the different production lines, even the multiple identical photomask patterns may require additional variations in sizing, orientation, scaling and other attributes to account for differences in the semiconductor manufacturing equipment. Similar adjustments may also be necessary to account for differences in the photomask manufacturer's lithography equipment. These differences need to be accounted for in the photomask manufacturing process.

Conventional integrated circuit manufacturing processes using photomasks require monitoring and adjustment on a frequent basis to optimize the quality of the final product and prevent errors from occurring. In this regard, information regarding, among other things, structural features of the photomask, the integrated circuit to be manufactured using the photomask, process parameters, and performance characteristics of the photomask, must be gathered, stored and regularly updated during the manufacturing process. This often requires numerous interruptions of the overall manufacturing process to conduct steps such as simulation of the photomask performance and sampling of the integrated circuit to determine whether adjustments to the process are required. For example, a sampling procedure may reveal that one or more manufacturing tools must be adjusted to compensate for errors or defects in the integrated circuit. The time required to sample the integrated circuit and perform other monitoring steps, analyze the results, and make the necessary adjustments to the manufacturing process may result in substantial delays, thereby generating a lower yield and a reduced overall profit margin for the integrated circuit manufacturer.

Also, it is important to provide protections against unauthorized actions with a photomask, either prior to, during, or after a manufacturing process using the photomask. The photomask is generally considered to be an "unsafe" or "unsecure" medium for electronics design information. This is for three primary reasons: a) the photomask is the first physical and measurable record of the electronic design information; b) the electronics design information, once recorded on the mask, cannot be encrypted or scrambled (it is possible however to manipulate the mask content in selective ways with mask repair equipment); and c) once the photomask is recorded on a wafer through wafer exposure by an optical imaging system, the wafer pattern reveals additional measurable information about the device pattern. In the extreme case, the device can be fabricated in whole in or in part by an unauthorized source if the masks are in the parties' possession.

As an example, photomasks used to fabricate military, government or personal information sensitive devices must be assured against manipulation or copy. Also, such protections is desirable for photomasks used to fabricate commercial devices in highly competitive applications, such as, for example, dynamic random access memories (DRAMs) and flash memories. An added concern in these applications is the relative simplicity of the patterns and the amount of competitive information that can be acquired through even visual inspection of the photomasks or patterned wafers.

Protection may also be necessary for photomasks used to evaluate new equipment or test new modules of technology in a multi-company or multi-party environment. This is especially important given the pervasive use of multi-company consortia for early research and development. In particular, the initial evaluation of equipment for new process nodes requires the most advanced mask information in a nominally uncontrolled environment such as a fabrication facility for equipment owned by a third party.

Providing protection for photomasks used to generally build devices in "wafer foundries" is also important. Securing and tracking intellectual property within the IC production process remains a key concern for end users.

Actions of unauthorized users that mask owners and other interested parties may seek to prevent include exposure of the mask on a wafer by a wafer exposure system, reverse engineering of the mask content by scanning the features of the mask with an electronic imaging system such as a mask inspection system, and manipulation of the mask content for purposes of changing the electrical properties of devices being fabricated by the mask. In the case of unauthorized mask exposure, such exposure may be used to partially or completely fabricate the device intended to be manufactured using the mask, reverse engineer the device or otherwise discover the elements of the device.

Photomasks are provided with some protection against unauthorized use using several conventional methods. For example, mask information may be scanned with a mask inspection or mask measuring system and compared to an electronic version of the design database. This can be used to test against mask manipulation when compared to a verified database. However, this protection method cannot prevent unauthorized exposure of the mask or physically secure the content on the mask. Alternatively, the layers of a full device can be separated to minimize the chance of reverse engineering the device content. In this case, half the device layers might be sent to foundry A while the other half might go to foundry B. Another protection method includes escorting the mask through the process by a designated security official. In general, there is no way at present to physically validate and secure the content of a mask at the point of use.

Accordingly, there is a need for a photomask that allows for, among other things, monitoring, analyzing and storing of information regarding an integrated circuit manufacturing process that uses the photomask, without requiring interruption of the manufacturing process, while separately providing a secure environment for the use of the photomask.

SUMMARY OF THE INVENTION

According to an exemplary embodiment of the present invention, a photomask for integrated circuit production for development of integrated circuit components, where the integrated circuit production uses a radiation source that generates a source image, comprises: a substrate with one or more layers disposed thereon; a source separator element that separates the source image into one or more duplicate source images; one or more polarizing elements each corresponding to one of the one or more duplicate source images; and one or more sensors each corresponding to one of the one or more polarizing elements, the one or more sensors sensing one or more radiation characteristics of the radiation source.

In at least one embodiment, the photomask comprises a first side exposed to the radiation source and a second side opposite the first side, and the source separator element is disposed at the first side of the photomask.

In at least one embodiment, the photomask comprises a first side exposed to the radiation source and a second side opposite the first side, and the source separator element is disposed at the second side of the photomask.

In at least one embodiment, the source separator element comprises a type of source separator element selected from the following source separator element types: an aperture, a grating and an optical element.

In at least one embodiment, the one or more polarizing elements are each configured to polarize radiation generated by the radiation source.

In at least one embodiment, each of the one or more polarizing elements polarize radiation according to one of the following polarization types: no polarization, linear polarization and circular polarization.

In at least one embodiment, the polarizing elements are selected from the following types of polarizing elements: wire grids, deposited films and waveplates.

In at least one embodiment, each of the one or more sensors senses the intensity of radiation forming the duplicate source image corresponding to the sensor.

In at least one embodiment, the one or more radiation characteristics of the radiation source comprise Stokes parameters of the radiation source.

In at least one embodiment, the photomask further comprises a pellicle having a pellicle plane.

In at least one embodiment, at least one of the one or more sensors is disposed at the pellicle plane.

A method of integrated circuit production for development of integrated circuit components according to an exemplary embodiment of the present invention, where the integrated circuit production uses a radiation source that generates a source image, comprises the steps of: providing a photomask comprising: a substrate with one or more layers disposed thereon; a source separator element that separates the source image into one or more duplicate source images; one or more polarizing elements each corresponding to one of the one or more duplicate source images; and one or more sensors each corresponding to one of the one or more polarizing components; separating the source image into one or more duplicate source images using the source separator element; polarizing each of the one or more duplicate source images using the one or more polarizing elements; sensing one or more radiation characteristics of the one or more polarized duplicate source images using the one or more sensors; and determining one or more radiation characteristics of the radiation source based on the one or more sensed radiation characteristics of the polarized duplicate source images.

In at least one embodiment, the source separator element comprises a type of source separator element selected from the following source separator element types: an aperture, a grating and an optical element.

In at least one embodiment, the one or more polarizing elements are each configured to polarize radiation generated by the radiation source.

In at least one embodiment, each of the one or more polarizing components polarize radiation according to one of the following polarization types: no polarization, linear polarization and circular polarization.

In at least one embodiment, the polarizing elements are selected from the following types of polarizing elements: wire grids, deposited films and waveplates.

In at least one embodiment, the one or more radiation characteristics of the radiation source comprise Stokes parameters of the radiation source.

BRIEF DESCRIPTION OF THE DRAWINGS

The above and related objects, features and advantages of the present invention will be more fully understood by reference to the following, detailed description of the preferred, albeit illustrative, embodiment of the present invention when taken in conjunction with the accompanying figures, wherein.

DETAILED DESCRIPTION OF PREFERRED EMBODIMENTS

Figure 1:
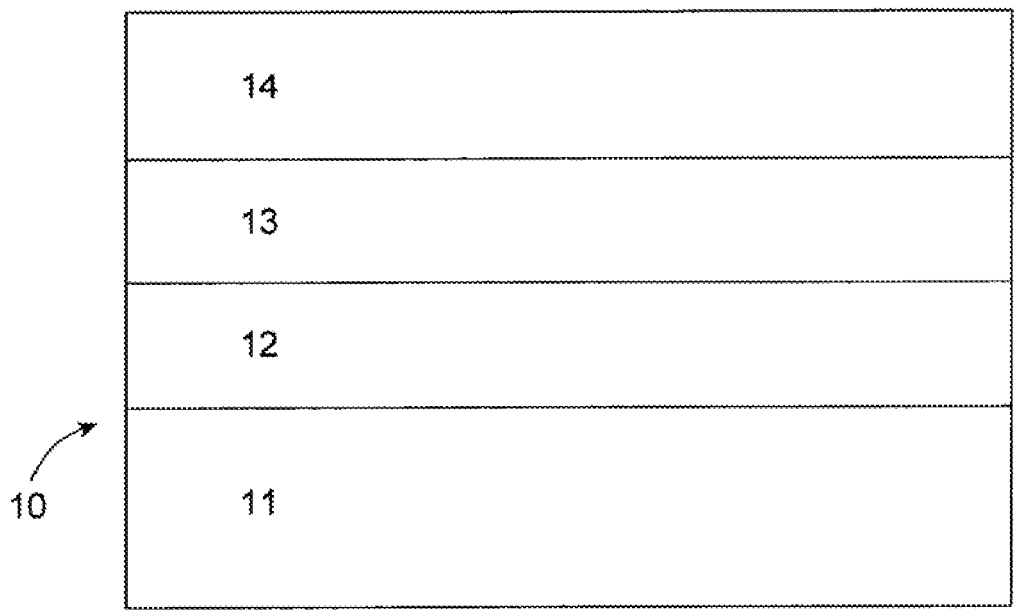
FIG. 1 represents a blank or undeveloped photomask of the prior art.

Various exemplary embodiments of the present invention are directed to a photomask having electronics and detection capability integrated into the photomask substrate to enable wireless or other type of communication of information between the photomask and other elements of mask and wafer manufacturing processes including but not limited to mask making equipment, wafer exposure equipment, design automation tools, simulation tools, process control systems and mask tracking/logistical/shipping systems. The inventive photomask preferably has the ability to detect irradiation used to expose photomasks onto a wafer, such as, for example, 193 nm laser light in a wafer exposure scanner or other appropriate wavelength laser light. As explained in further detail below, such detected information may to be stored and analyzed for improving process capability. Information relevant to the manufacturing of the photomask, such as pattern metrology data, defects, and registration information, as well as information capturing certain characteristics of the device layout written on the photomask, such as frequency composition of the layout, criticality of certain areas of the layout and tolerances required for creating a functioning device may also be stored using the components of the inventive photomask. In addition to storage capabilities, the photomask according to various exemplary embodiments of the present invention may include computational logic needed to draw specific conclusions from stored data and to interact productively with complementary members of the manufacturing process.

The inventive photomask may be used in a closed or open loop manufacturing process to accomplish tasks such as passing of layout specific data to a wafer exposure system in order to optimize the printing of the mask pattern on the wafer, passing of information from the mask to a simulation system to assess the manufacturing attributes of the mask, passing of the manufactured characteristics of the mask into a process control system, monitoring and characterization of the wafer exposure in terms of exposure level, vibration, position, mask illumination characteristics, scattered light etc., monitoring of the physical location of the mask for use in a logistical control system, measurement of the image characteristics in a reflected light mode, and passing of information to a centralized database to allow automated record keeping on mask characteristics, simulation results, exposure information and so on. In general, the inventive photomask may be used to monitor an integrated circuit manufacturing environment, either prior to, during, or after the actual manufacturing process. For the purposes of this disclosure, the term "monitor" is intended to encompass any action that the inventive photomask may take relative to the manufacturing environment, such as, for example, measuring, diagnosing, characterizing, transmitting, receiving, testing, and optimizing.

It should be appreciated that the present invention is applicable to the manufacture of integrated circuits, and the term "integrated circuits" as used herein is intended to cover any devices that include an electric circuit, having semiconductor components or otherwise, including but not limited to display devices, such as liquid crystal displays and plasma displays, microcontrollers, memory devices, processors, sensors, power management circuits and amplifiers.

Figure 6:
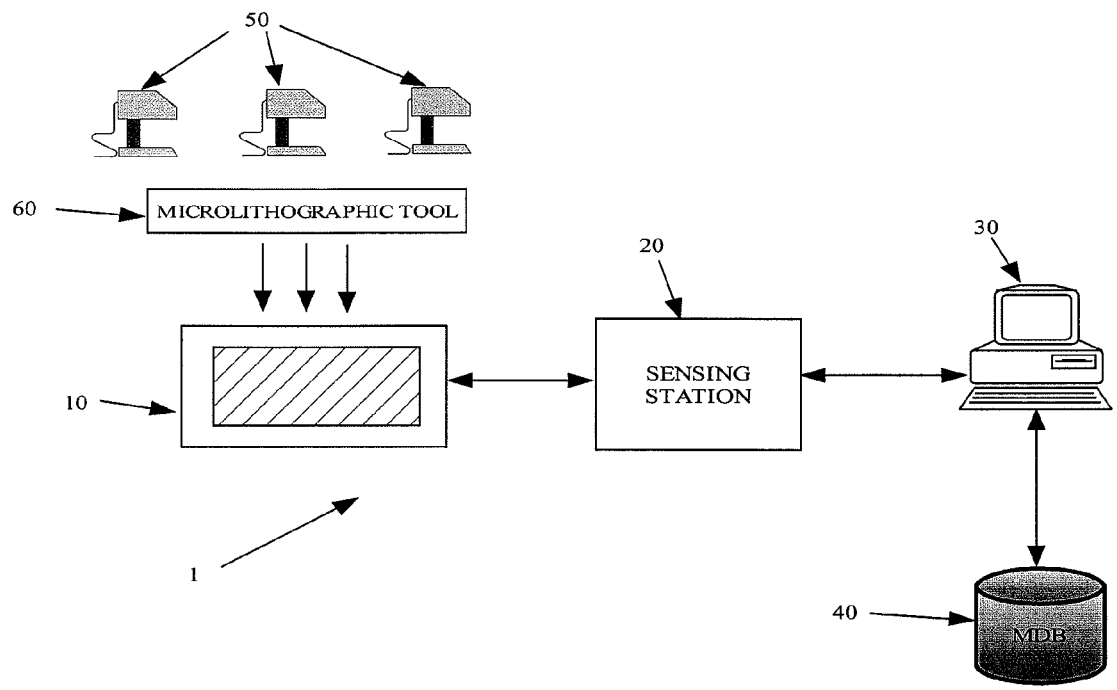
FIG. 6 is a block diagram of a system for monitoring an integrated circuit manufacturing process according to an exemplary embodiment of the present invention.

FIG. 6 shows a system, generally designated by reference number 1, for monitoring an integrated circuit manufacturing process according to an exemplary embodiment of the present invention. The system 1 includes a photomask 10, a sensing station 20, a computer workstation 30, a photomask database 40, an exposure tool, such as microlithographic tool 60, as well as other wafer manufacturing components 50.

Figure 2:
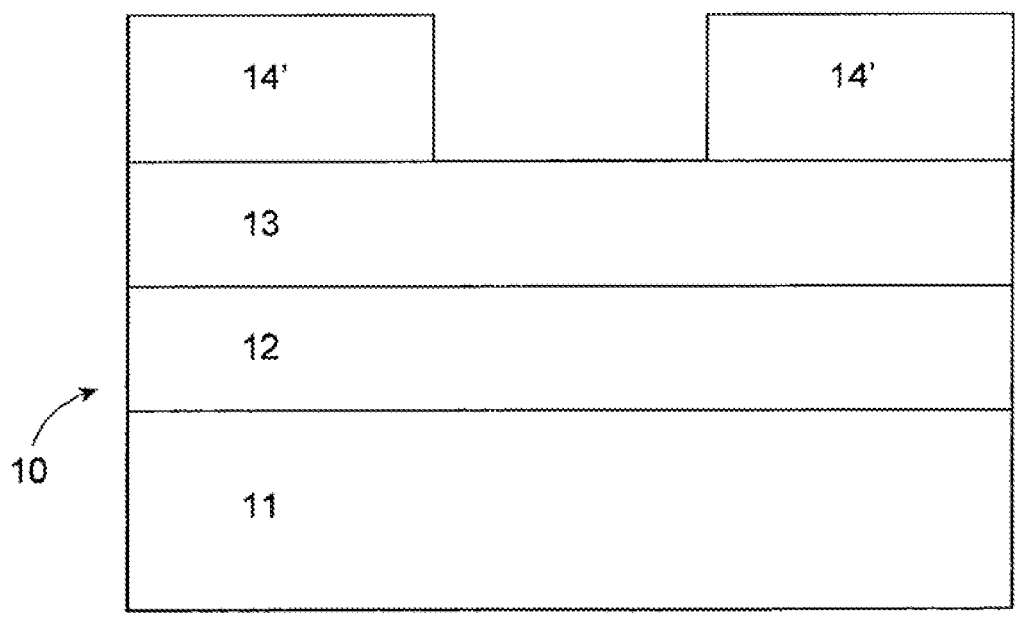
FIG. 2 represents the photomask of FIG. 1 after it has been partially processed.
Figure 3:
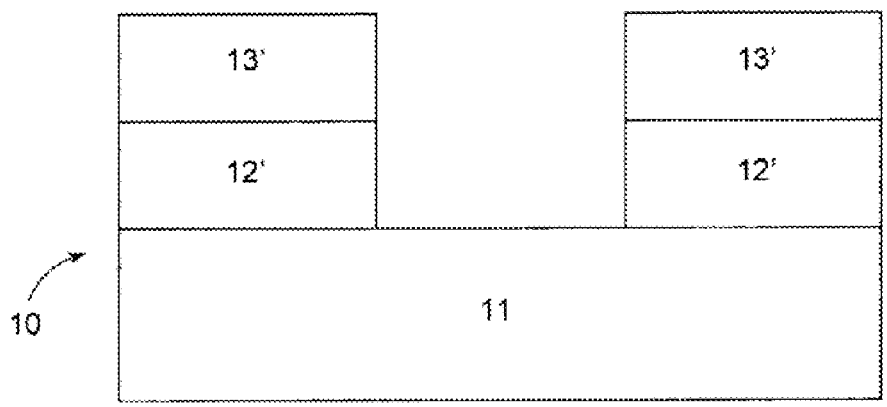
FIG. 3 represents the photomask of FIGS. 1 and 2 after it has been fully processed.
Figure 4:
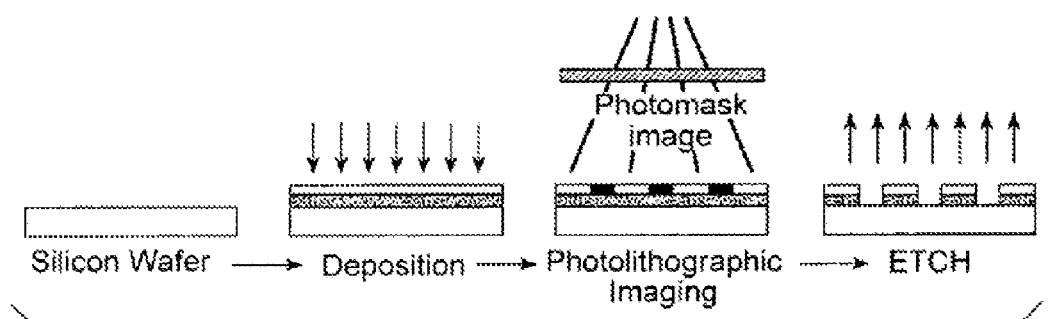
FIG. 4 is a flowchart showing the method of using a processed photomask to make or process a semiconductor wafer.
Figure 5:
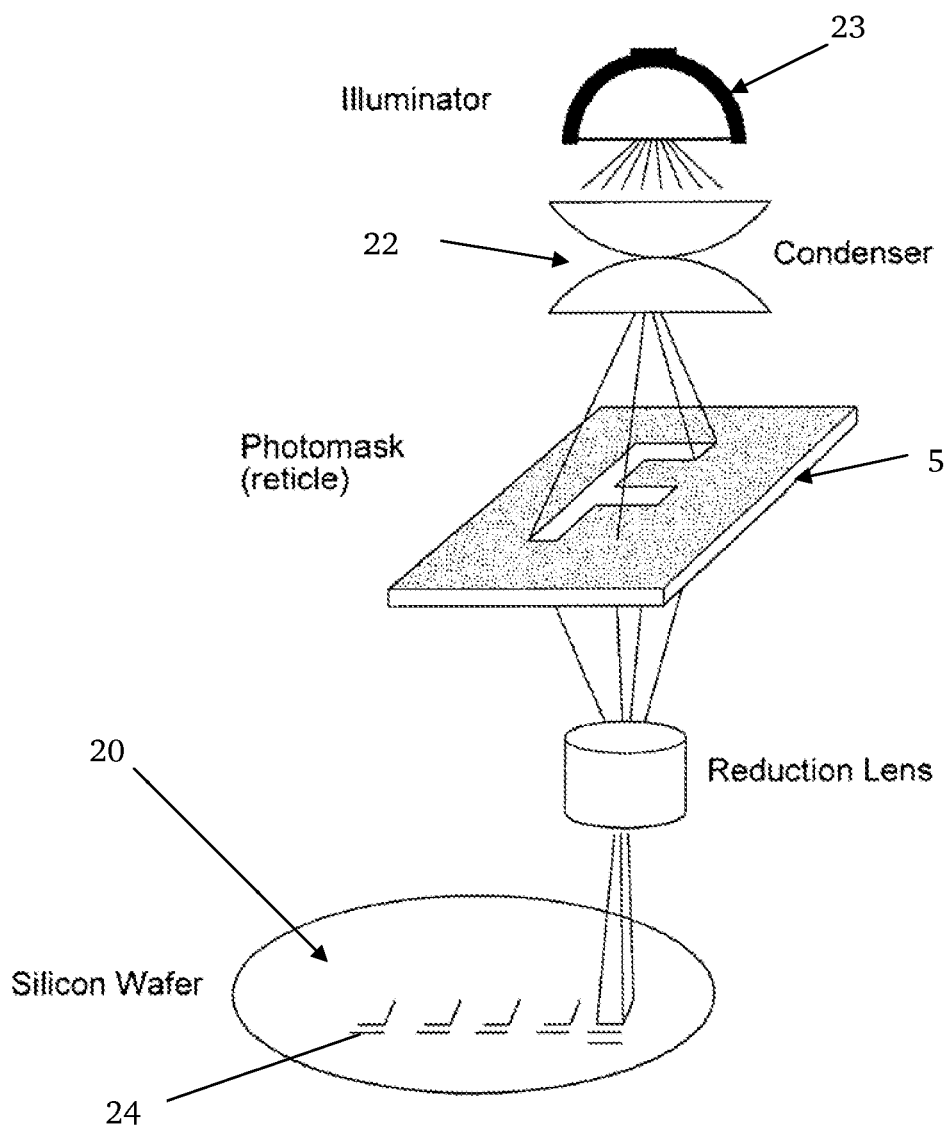
FIG. 5 shows the process of making a semiconductor using a wafer stepper.
Figure 7:
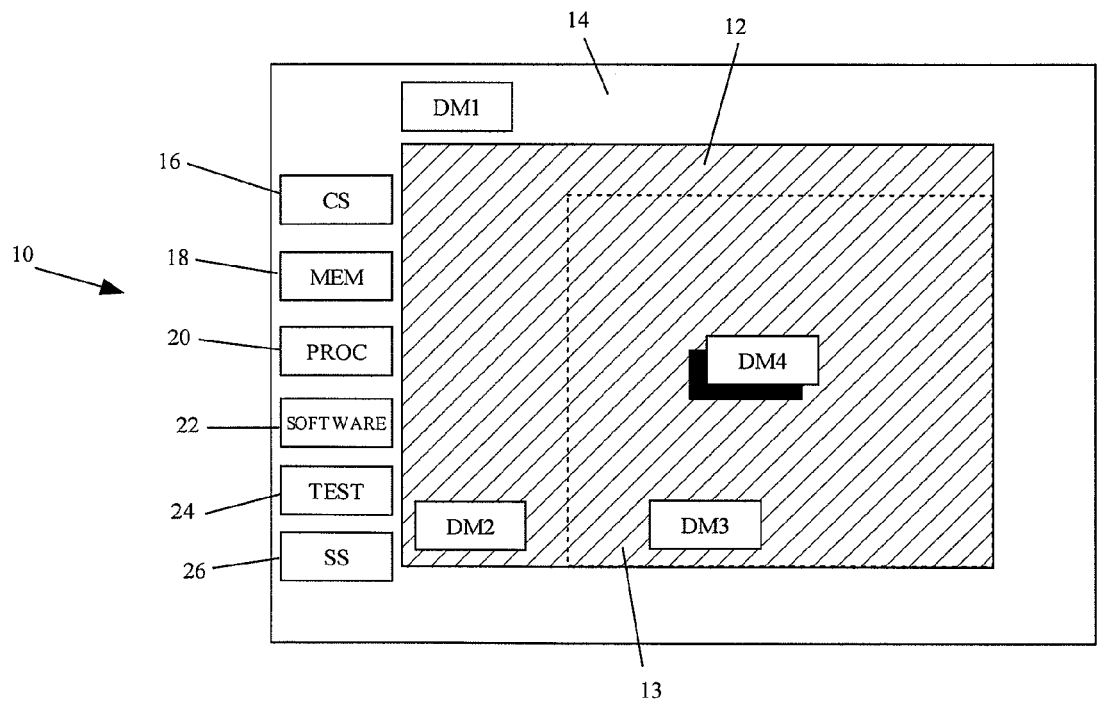
FIG. 7 is a plan view of a photomask according to an exemplary embodiment of the present invention.
Figure 8A:
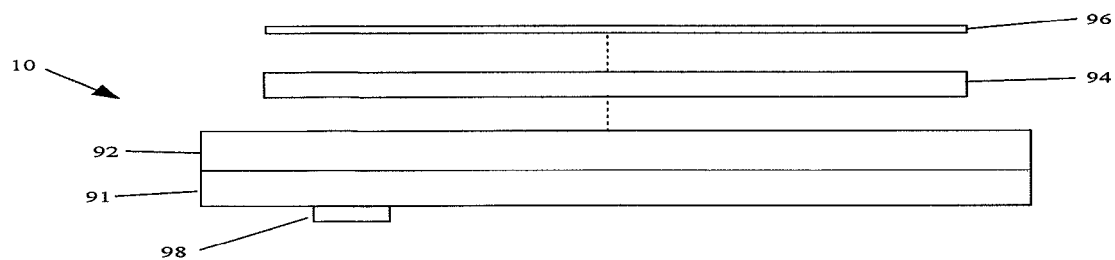
FIGS. 8A-8D are cross sectional views of a photomask according to an exemplary embodiment of the present invention.
Figure 8B:
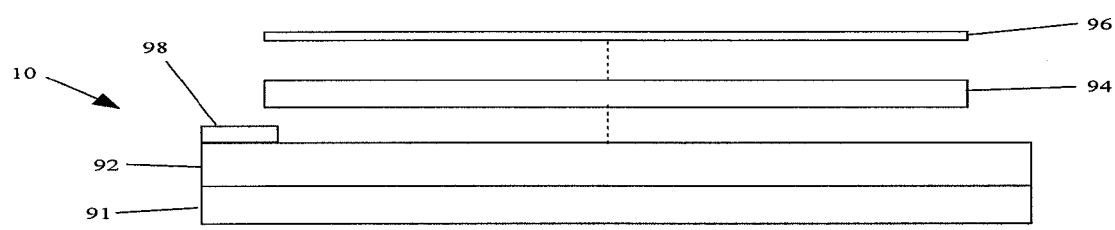
Figure 8C:
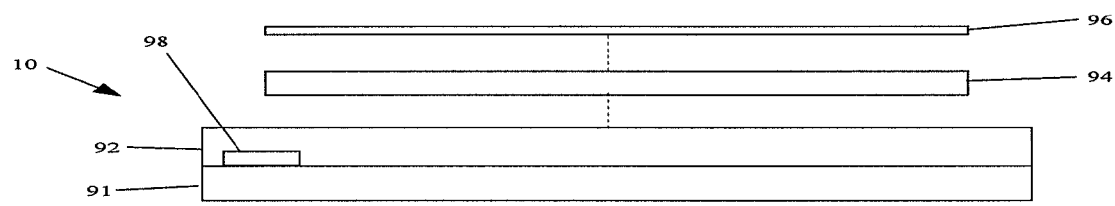
Figure 8D:
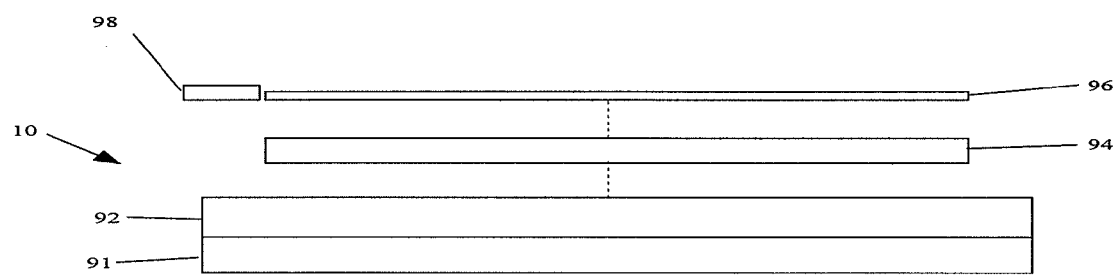

FIG. 7 is a detailed plan view of the photomask 10 according to an exemplary embodiment of the present invention. The photomask 10 includes a non-active patterned area 12, an active patterned area 13 and a non-active non-patterned area 14. A detection system, including various detection modules DM1, DM2, DM3 and DM4, is integrated into the photomask 10. The detection system is capable of detecting at least one characteristic and preferably able to sense more than one characteristic of the photomask and/or manufacturing process parameters. In this regard, in order to fully detect and retrieve data from various locations on the photomask, the detection modules DM1-DM4 may be located at different regions within the photomask. For example, FIG. 2 shows the detection module DM1 located in non-active non-patterned region 14, the detection module DM2 located in non-active patterned area 12, and the detection module DM3 located in active patterned area 13. The detection module DM4 may be located in the pellicle plane or at some other standoff distance from the primary mask pattern. The detection modules DM1-DM4 may include circuitry that is capable of detecting and/or monitoring any type of desired information, such as, for example, exposure level, vibration, position, illumination characteristics, scattered light, diffracted light, image characteristics in a reflected light mode, and the physical location of the photomask.

The detection system may also include a photochemical recording medium, such as, for example, a photoresist, that is able to record a signal at the photomask 10 that may be analyzed later using standalone measurement equipment. For example, FIGS. 8A-D shows a photoresist 98 included with the photomask 10, where the photomask 10 includes a first substrate 91, a second substrate 92, one or more layers 94 and a pellicle layer 96. The photoresist 98 may be disposed at the bottom of the photomask 10 (FIG. 8A), at the top of the photomask 10 (FIG. 8B), between the two substrates 91, 92 at the mask plane (FIG. 8C), at the pellicle plane (FIG. 8D) or at any other suitable location on or external to the photomask 10.

The photomask 10 also includes a communication system 16, which preferably includes a wireless transmitter, that sends information gathered by the detections modules DM1-DM4 to the sensing station 20. In this regard, the sensing station 20 may include a wireless receiver for retrieving the information transmitted by the communication system 16. In embodiments of the invention, the photomask 10 may include an interface for connection of hard wiring or a memory storage device such as a memory stick.

The photomask 10 further includes a memory system 18 that uses a storage medium, such as a flash memory. The memory system 18 is preferably configured to store monitored process parameters and photomask manufacturing information. For example, the memory system 18 may store pattern metrology data, a defect profile, registration information, critical dimensions, layout characteristics, image fidelity and materials information. The memory system 18 may also store, either separately or with other information, device layout information, such as, for example, frequency composition of the layout, information relating to criticality of selected areas of the layout, and required tolerances for creating a functioning device.

The photomask 10 may also include a logic processing unit 20 to manipulate data stored in the memory system 18 and/or data retrieved by the detection system to generate information to be transmitted to the sensing station 20. In this regard, software 22 may be integrated into the photomask 10 that generates instructions to be run on the logic processing system 20 to carry out the analysis of data and/or manage the operation of electronics that connect the detection system, the memory system 18 and the logic processing unit 20.

The computer workstation 30 may be accessed by a user to monitor the information retrieved by the sensing station 20 from the photomask 10, and make adjustments to the manufacturing components 50 based on the information transmitted by the photomask 10. Alternatively, or in addition, the computer workstation 30 may include software and or/hardware that automatically adjusts operation of the manufacturing components 50 based on the transmitted information, so that feedback loops may be generated between the photomask 10 and the manufacturing components 50. In this regard, the mask database 40 may be used to store and maintain mask and process specific information. The mask database 40 may be maintained at the computer workstation 30 or at a remote location, and may be integrated into a network for access by other users.

The photomask 10 may also include a test structure 24 that diffracts, directs or otherwise conditions input radiation of a desired frequency or wavelength to render a more meaningful measurement on the electronic or photochemical detectors. The test structures 24 may be placed on the top, bottom or pellicle areas of the photomask. In an exemplary embodiment, the test structure 24 includes a diffraction grating on the top of the mask that works in concert with the detection plane. Such test structures may contain moving parts as in an integrated microelectromechanical systems (MEMS) device or an oscillating device.

The photomask 10 may also include a security system 26 for validating and securing the content of the photomask 10. The security system 26 may incorporate other components of the photomask 10, such as the communication system 16 and the detection system. For example, the communication system 16 may be used to pass an encrypted signal or code to a manufacturing tool to validate the connection of the mask to the tool. Once the connection is validated, the communication system 16 may pass critical information to the tool which is necessary to initialize or continue the manufacturing process. The security system 26 may also incorporate an optical detector from the detection system that can detect a scattered light thumbprint of the photomask 10 to ensure that the photomask 10 has not been manipulated or replaced in the chip fabrication process.

Figure 9:
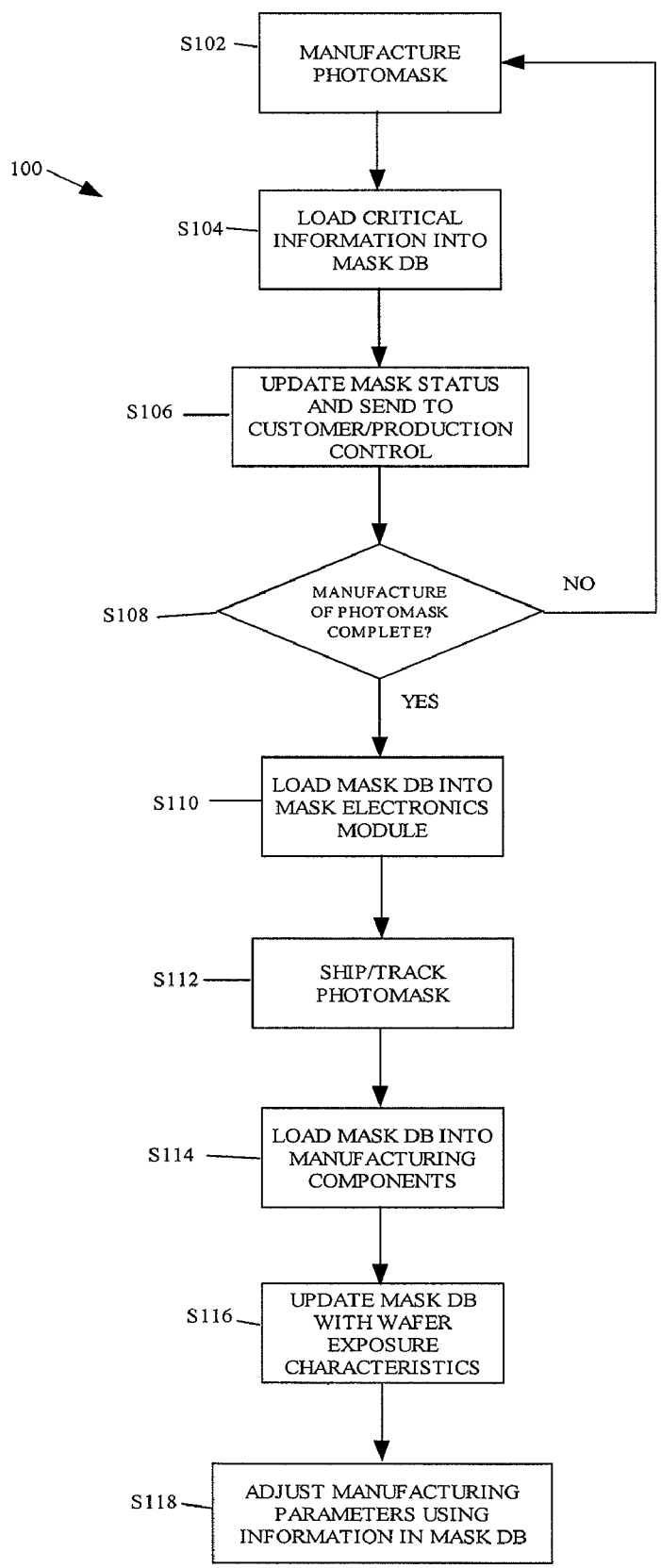
FIG. 9 is a flowchart showing a method for monitoring a photomask according to an exemplary embodiment of the present invention.

FIG. 9 is a flowchart showing a method, generally designated by reference number 100, for monitoring a photomask according to an exemplary embodiment of the present invention. In step S102, a photomask is manufactured based on customer requirements using processes well known in the art. In step S104, critical information is loaded into a mask database during the manufacturing process. Such critical information may include, for example, critical dimensions, layout characteristics, defect profile, registration, image fidelity, and materials information. In step S106, the status of the photomask is updated and the status information is sent to the customer and production control. In step S108, it is determined whether manufacture of the photomask is complete. If not, the process 100 returns to step S102, where manufacturing continues. Otherwise, the process 100 continues to step S110, where the mask database is loaded into the mask electronics module, which can be located either on the photomask or at a remote location.

In step S112, the photomask is shipped and may be electronically tracked using the communication system within the photomask. In step S114, either prior to or upon arrival at the manufacturing site, the mask database is loaded into various components, such as a simulation system, an exposure system and a fab control system. In step S116, the mask database is updated with wafer exposure characteristics. In step S118, the information within the mask database, including the critical mask information and the wafer exposure characteristics, is used to adjust manufacturing parameters prior to and during manufacture of the wafer using the photomask.

Figure 10:
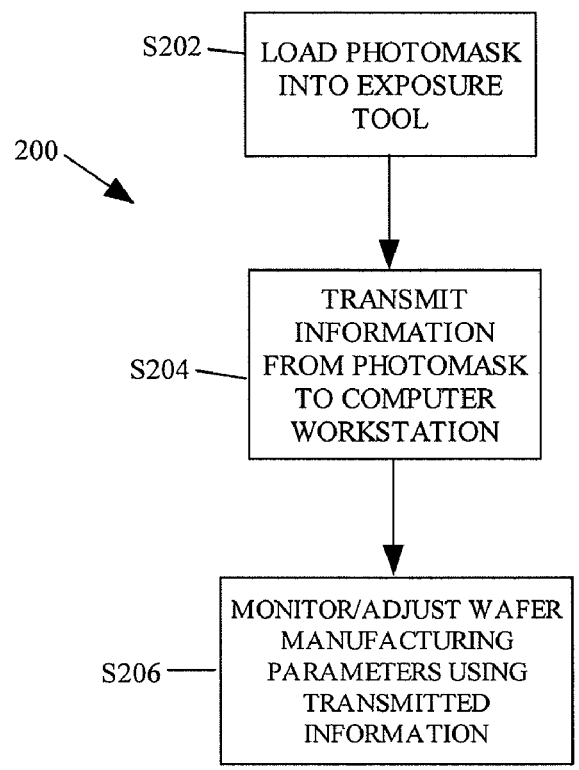
FIG. 10 is a flowchart showing a method for monitoring a wafer manufacturing process using a feedback loop according to an exemplary embodiment of the present invention.

FIG. 10 is a flowchart showing a method, generally designed by reference number 200, for monitoring a wafer manufacturing process using a feedback loop according to an exemplary embodiment of the present invention. In step S202 of the process 200, a photomask according to the present invention is loaded into an exposure tool. In step S204, information gathered by the detecting system on the photomask or stored in the memory on the photomask is transmitted to a computer workstation. For example, information regarding diffracted light from the mask as detected by the detection system, or information regarding across field critical dimension variation or pattern layout stored within the memory of the photomask may be transmitted. In step S206, the information transmitted by the photomask is used to monitor and/or adjust manufacturing parameters, as appropriate. For example, intensity detected in step S204 may be compared with a database image of an expected result to monitor the effectiveness of the mask. In the case of the CD variation being transmitted by the photomask, the operation of the exposure tool may be adjusted to compensate for CD error by introducing a dose variation. In the case of the pattern layout being transmitted by the photomask, the exposure tool source may be optimized based on the layout data.

Figure 11:
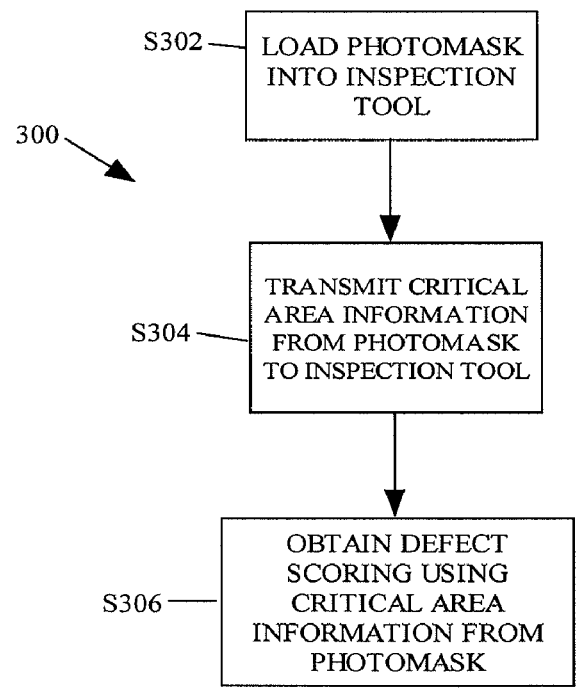
FIG. 11 is a flowchart showing a method for inspecting a photomask using a feedback loop according to an exemplary embodiment of the present invention.

FIG. 11 is a flowchart showing a method, generally designated by reference number 300, for inspecting a photomask using a feedback loop according to an exemplary embodiment of the present invention. In step S302 of the process 300, the photomask is loaded into an inspection tool. In step S304, critical area information stored within the photomask memory is transmitted to the inspection tool. In step S306, defect scoring is obtained using the critical area information transmitted by the photomask.

Figure 12A:
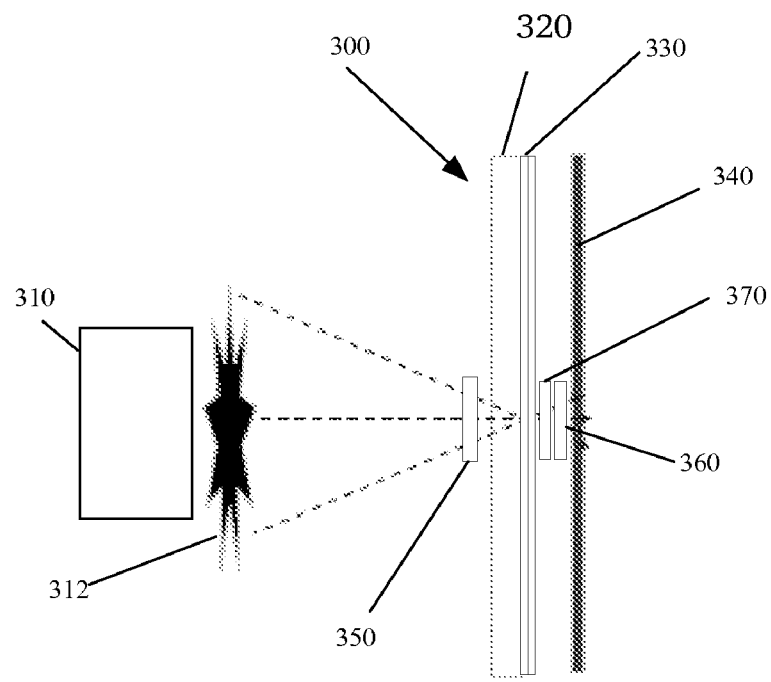
FIG. 12A is a cross-sectional view of a photomask according to another exemplary embodiment of the present invention.
Figure 12B:
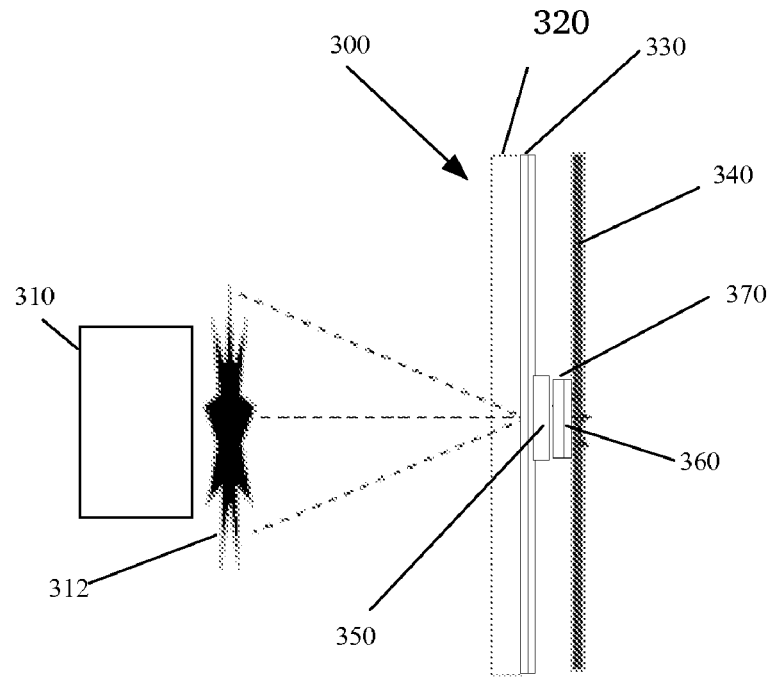
FIG. 12B is a cross-sectional view of a photomask according to another exemplary embodiment of the present invention.

FIGS. 12A and 12B are cross-sectional views of a photomask, generally designated by reference number 300 according to another exemplary embodiment. The photomask 300 may be used in conjunction with a radiation source 310, such as a stepper, to develop an image 312 on a semiconductor wafer to form an integrated circuit. The photomask 300 includes a substrate 310, one or more layers 330 disposed over the substrate 320, and a pellicle 340 disposed over the one or more layers 330. The photomask 300 may also include a source separator element 350 that separates the source image 312 into a plurality of images, which are preferably smaller than the original source image 312. A sensor or sensor array 360 is disposed between the source separator element 350 and the pellicle 340. For example, the sensor array 360 may be disposed at the pellicle plane. As discussed below, the sensor array 360 may include a number of sensor elements, and each sensor element is preferably capable of detecting a radiation characteristic of the radiation source based on the separated image incident on the sensor element.

Figure 13:
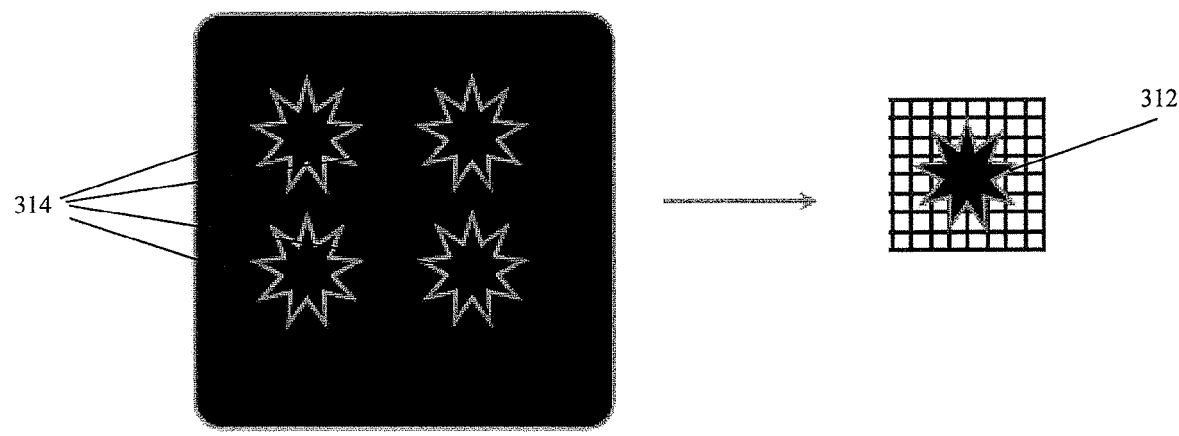
FIG. 13 shows a source image separated into duplicate source images according to an exemplary embodiment of the present invention.

The source separator element 350 may be disposed at the side of the photomask 300 that is exposed to the radiation source 310, as shown in FIG. 12A, or alternatively the source separator element 350 may be disposed at the side opposite the side exposed to the radiation source 310, as shown in FIG. 12B. The source separator element 350 may be any suitable element that causes separation between the illuminating beam angles of the radiation source 310, such as, for example, an aperture, a grating, a prism, or other optical element. Preferably, the source separator element 350 separates the source image 312 into four duplicate images 314, as shown in FIG. 13. However, it should be appreciated that the source separator element 350 may separate the source image 312 into any number of duplicate or dissimilar images, depending on the intended use of the sensor array 360.

In the present exemplary embodiment, the sensor array 360 may be used to determine the source polarization of the radiation source 310 by measuring the Stokes parameters of the radiation source 310. In this regard, the photomask 300 may further include a polarizing element 370 disposed between the source separator element 350 and the sensor array 360. The polarizing element 370 preferably includes a number of individual polarizing components each corresponding to one of the sensor elements of the sensor array 360. Each polarizing component may be, for example, a linear polarizer, such as a wire grid, a deposited film or a waveplate, or a circular polarizer, such as a waveplate formed from natural or stress induced birefringence at the exposing wavelength.

Each polarizing component of the polarizing element 370 may be configured to polarize an incident illumination beam in a different manner. In particular, in order for each sensor element to measure a different one of the four Stokes parameter, four corresponding polarizing components may be used, where a first polarizing component linearly polarizes light at horizontal, a second polarizing component linearly polarizes light at +45, a third polarizing element circularly polarizes light, and an optional fourth polarizing element passes all light.

The Stokes parameters measured by the sensor array 360 can be used to determine a variety of radiation characteristics of the radiation source 310, such as, for example, the radiation source polarization, the radiation source shape, the radiation source size, and the total delivered exposure dose. In this regard, as in previously described embodiments, the photomask 300 may also include a memory system, a logic processing unit to manipulate data stored in the memory system and/or data retrieved by the sensor array to generate information to be transmitted to a sensing station. Further, software may be integrated into the photomask 300 that generates instructions to be run on the logic processing system to carry out the analysis of data and/or manage the operation of electronics that connect the sensory array 360, the memory system and the logic processing unit 20.

In addition, a computer workstation may be accessed by a user to monitor the information retrieved by the sensor array 360, and make any necessary adjustments to the radiation source and/or other manufacturing components. Alternatively, or in addition, the computer workstation may include software and or/hardware that automatically adjusts operation of the manufacturing components based on the transmitted information, so that feedback loops may be generated between the photomask 300 and the manufacturing components.

It should be appreciated that the polarizing element 370 is not necessary, and in other exemplary embodiments of the present invention, the source separator element 350 and the sensor array 360 may be used without the polarizing element 370 to determine the shape, fidelity and size of the radiation source. Further, in other exemplary embodiments of the invention, variations of radiation characteristics of the source at different points across the reticle plane may be measured by multiple placements of source separator elements and sensor arrays.

Now that the preferred embodiments of the present invention have been shown and described in detail, various modifications and improvements thereon will become readily apparent to those skilled in the art. The present embodiments are therefore to be considered in all respects as illustrative and not restrictive, the scope of the invention being indicated by the appended claims, and all changes that come within the meaning and range of equivalency of the claims are therefore intended to be embraced therein.

What is claimed is:

1. A photomask for integrated circuit production for development of integrated circuit components, the integrated circuit production using a radiation source that generates a source image, the photomask comprising:
 a substrate with one or more layers disposed thereon;
 a source separator element that separates the source image into one or more duplicate source images;
 one or more polarizing elements each corresponding to one of the one or more duplicate source images; and
 one or more sensors each corresponding to one of the one or more polarizing elements, the one or more sensors sensing one or more radiation characteristics of the radiation source.

2. The photomask of claim 1, wherein the photomask comprises a first side exposed to the radiation source and a second side opposite the first side, and the source separator element is disposed at the first side of the photomask.

3. The photomask of claim 1, wherein the photomask comprises a first side exposed to the radiation source and a second side opposite the first side, and the source separator element is disposed at the second side of the photomask.

4. The photomask of claim 1, wherein the source separator element comprises a type of source separator element selected from the following source separator element types: an aperture, a grating and an optical element.

5. The photomask of claim 1, wherein the one or more polarizing elements are each configured to polarize radiation generated by the radiation source.

6. The photomask of claim 5, wherein each of the one or more polarizing elements polarize radiation according to one of the following polarization types: no polarization, linear polarization and circular polarization.

7. The photomask of claim 1, wherein the polarizing elements are selected from the following types of polarizing elements: wire grids, deposited films and waveplates.

8. The photomask of claim 1, wherein each of the one or more sensors senses the intensity of radiation forming the duplicate source image corresponding to the sensor.

9. The photomask of claim 1, wherein the one or more radiation characteristics of the radiation source comprise Stokes parameters of the radiation source.

10. The photomask of claim 1, further comprising a pellicle having a pellicle plane.

11. The photomask of claim 10, wherein at least one of the one or more sensors is disposed at the pellicle plane.

12. A method of integrated circuit production for development of integrated circuit components, the integrated circuit production using a radiation source that generates a source image, comprising the steps of:
   providing a photomask comprising:
      a substrate with one or more layers disposed thereon;
      a source separator element that separates the source image into one or more duplicate source images;
      one or more polarizing elements each corresponding to one of the one or more duplicate source images; and
      one or more sensors each corresponding to one of the one or more polarizing components;
   separating the source image into one or more duplicate source images using the source separator element;
   polarizing each of the one or more duplicate source images using the one or more polarizing elements;
   sensing one or more radiation characteristics of the one or more polarized duplicate source images using the one or more sensors; and
   determining one or more radiation characteristics of the radiation source based on the one or more sensed radiation characteristics of the polarized duplicate source images.

13. The method of claim 12, wherein the source separator element comprises a type of source separator element selected from the following source separator element types: an aperture, a grating and an optical element.

14. The method of claim 12, wherein the one or more polarizing elements are each configured to polarize radiation generated by the radiation source.

15. The method of claim 14, wherein each of the one or more polarizing components polarize radiation according to one of the following polarization types: no polarization, linear polarization and circular polarization.

16. The method of claim 12, wherein the polarizing elements are selected from the following types of polarizing elements: wire grids, deposited films and waveplates.

17. The method of claim 12, wherein the one or more radiation characteristics of the radiation source comprise Stokes parameters of the radiation source.

* * * * *